United States Patent [19]
Hartig et al.

[11] Patent Number: 6,159,607
[45] Date of Patent: *Dec. 12, 2000

[54] HEAT TREATABLE, DURABLE, IR-REFLECTING SPUTTER-COATED GLASSES AND METHOD OF MAKING SAME

[75] Inventors: Klaus W. Hartig, Brighton; Philip J. Lingle, Temperance, both of Mich.

[73] Assignee: Guardian Industries Corp., Auburn Hills, Mich.

[ * ] Notice: This patent is subject to a terminal disclaimer.

[21] Appl. No.: 09/332,897

[22] Filed: Jun. 15, 1999

Related U.S. Application Data

[63] Continuation of application No. 08/486,643, Jun. 7, 1995, which is a continuation-in-part of application No. 08/102,281, Aug. 5, 1993, abandoned.

[51] Int. Cl.$^7$ ..................................................... B32B 17/00
[52] U.S. Cl. ...................... 428/426; 428/428; 428/432; 428/433; 428/469; 428/472; 65/60.2; 65/60.3; 427/585; 427/166; 427/167
[58] Field of Search ..................................... 428/426, 428, 428/432, 433, 469; 420/472; 65/60.2, 60.5; 427/585, 166, 167

[56] References Cited

U.S. PATENT DOCUMENTS

| | | |
|---|---|---|
| 3,272,986 | 9/1966 | Schmidt . |
| 3,681,042 | 8/1972 | Edwards et al. . |
| 3,798,146 | 3/1974 | Chong et al. . |

(List continued on next page.)

FOREIGN PATENT DOCUMENTS

| | | |
|---|---|---|
| 0301755 | 2/1989 | European Pat. Off. . |
| 0332717 | 9/1989 | European Pat. Off. . |
| 0386993 | 9/1990 | European Pat. Off. . |
| 0456487 | 11/1991 | European Pat. Off. . |
| 0546302 | 6/1993 | European Pat. Off. . |
| 0546470 | 6/1993 | European Pat. Off. . |
| 0560534 | 9/1993 | European Pat. Off. . |
| 0567735 | 11/1993 | European Pat. Off. . |
| 0622645 | 11/1994 | European Pat. Off. . |
| 0638659 | 2/1995 | European Pat. Off. . |
| 0646551 | 4/1995 | European Pat. Off. . |
| 2543532 | 11/1986 | France . |
| 9002653 | 3/1990 | WIPO . |
| 9005439 | 5/1990 | WIPO . |
| 9008334 | 7/1990 | WIPO . |

OTHER PUBLICATIONS

"Principles of Design of Architectural Coatings", Applied Optics, vol. 22, No. 24, Dec. 15, 1983, pp. 4127–4141.
"Planitherm Standard" Bendable Silver–Based Low Emissivity Coating on Glass (1989) Solar Energy Mat. 19 (no month).
"Solar Optical Properties of Thin Films of Cu, Ag, Au Cr, Fe, Co, Ni and AL" Solar Energy vol. 32 (1984) (no month).
Airco Super—E III™ Coating Process Release.
Airco Super–E IV™ Technology Process Release, pp. 1–23.
1991 Proposed ASTM Standard "Test Method for Measuring and Calculating Emittance of Architectural Flat Glass Products Using Radiometric Measurements".
ASTM Designation : E 424–71 "Standard Test Methods for Solar Energy Transmittance and Reflectance (Terrestrial) of Sheet Materials".
"Performance and Sputtering Criteria of Modern Architectural Glass Coatings" SPIE vol. 325 Optical Thin Films (1982) (no month).
EPO Search Report, EP 96 10 4113.

*Primary Examiner*—Timothy M. Speer
*Attorney, Agent, or Firm*—Hall, Priddy, Myers & Vande Sande

[57] ABSTRACT

A heat treatable, durable and chemically resistant layer system for glasses used for automotive and architectural purposes includes a metallic layer of nickel or alloy thereof overcoated with silicon nitride ($Si_3N_4$). The layer system may include an undercoat of silicon nitride ($Si_3N_4$) and the metallic layer may also include silicon nitride. The metallic layer may be partially oxidized or surrounded by layers of stoichiometric oxides of the metal. The metallic layer, however, should not contain a nitride.

36 Claims, 2 Drawing Sheets

U.S. PATENT DOCUMENTS

| | | |
|---|---|---|
| 3,826,728 | 7/1974 | Chambers et al. |
| 3,935,351 | 1/1976 | Franz |
| 4,166,018 | 8/1979 | Chapin |
| 4,179,181 | 12/1979 | Chang |
| 4,413,877 | 11/1983 | Suzuki et al. |
| 4,450,201 | 5/1984 | Brill et al. |
| 4,462,883 | 7/1984 | Hart |
| 4,594,137 | 6/1986 | Gillery et al. |
| 4,680,742 | 7/1987 | Yamada et al. |
| 4,715,879 | 12/1987 | Schmitte et al. |
| 4,769,291 | 9/1988 | Belkind et al. |
| 4,780,372 | 10/1988 | Tracy et al. |
| 4,790,922 | 12/1988 | Huffer |
| 4,799,745 | 1/1989 | Meyer et al. |
| 4,816,034 | 3/1989 | Bhatt et al. |
| 4,826,525 | 5/1989 | Chesworth et al. |
| 4,857,094 | 8/1989 | Groth et al. |
| 4,948,482 | 8/1990 | Kobayashi et al. |
| 4,954,232 | 9/1990 | Yamada et al. |
| 4,960,645 | 10/1990 | Lingle et al. |
| 4,965,121 | 10/1990 | Young et al. |
| 5,062,937 | 11/1991 | Komuro |
| 5,188,887 | 2/1993 | Lingle et al. |
| 5,229,194 | 7/1993 | Lingle et al. |
| 5,242,560 | 9/1993 | Lingle et al. |
| 5,344,718 | 9/1994 | Hartig et al. |
| 5,376,455 | 12/1994 | Hartig et al. |
| 5,377,045 | 12/1994 | Wolfe et al. |
| 5,403,458 | 4/1995 | Hartig et al. |
| 5,543,229 | 8/1996 | Ohsaki et al. |
| 5,557,462 | 9/1996 | Hartig et al. |
| 5,563,734 | 10/1996 | Wolfe et al. |

FIG. 5B

HEAT TREATABLE, DURABLE, IR-REFLECTING SPUTTER-COATED GLASSES AND METHOD OF MAKING SAME

RELATED APPLICATION

This is a continuation of application Ser. No. 08/486,643 filed Jun. 7, 1995, which is a continuation-in-part of application Ser. No. 08/102,281 filed Aug. 5, 1993 abandoned.

FIELD OF INVENTION

This invention relates to sputter-coated glasses and methods of making them. More particularly, this invention relates to sputter-coated glasses which are heat treatable and durable and whose solar management properties may be varied over a wide range so as to be useful for architectural, automotive and residential purposes.

BACKGROUND OF THE INVENTION

The popularity of metal and metal oxide coated glasses in architectural and automotive design is well known. As reported prolifically in patent and other literature, such glasses, usually achieve, through the manipulation of the coating's layering system, quite acceptable degrees of reflectance, transmittance, emissivity, chemical resistance, and durability, as well as the color desired. See, for example, in this respect, U.S. Pat. Nos. 3,935,351; 4,413,877; 4,462,883; 3,826,728; 3,681,042; 3,798,146; and 4,594,137 just to name a few.

It has also been well reported that while several reasonably acceptable techniques exist for applying such coatings, one of the most efficacious, and thus preferred, is the well known technique referred to as "magnetically enhanced sputter coating". Such a technique is reported in U.S. Pat. No. 4,166,018, a recognized fundamental teaching on the subject. (See also, Munz et al "Performance and Sputtering Criteria of Modern Architectural Glass Coatings", SPIE Vol. 325, *Optical Thin Films*, 1982, pp. 65–73.)

While efficacious for many known layer systems, the use of certain older sputter coating system has been known to result in mechanical durability qualities less than that achieved by another known method called the "pyrolytic" technique. As a reverse function, however, sputter-coated systems often achieve better infrared reflectance than typical pyrolytic coatings. Also, sputter-coated glasses have generally been recognized as having superior optical and thermal performance characteristics than pyrolytically formed coatings, such as having improved coating uniformity, good emittance, and better solar performance characteristics. It is clear, that if a sputter-coating technique could be devised for a particular coating system wherein the mechanical durability qualities of the sputter-coated system could approach or equal that of a pyrolytic technique, while at the same time achieving the enhanced benefits of sputter-coated technology, a significant step forward in the art would be made.

In U.S. Pat. No. 5,229,194, entitled "Improved Heat Treatable Sputter-Coated Glass Systems" there are disclosed certain unique layer systems that achieved this significant step forward in the art. These systems are prior art to the subject invention due to commercial sale more than one year prior to our filing date herein. They are discussed more fully below.

Firstly, however, it should be stated that in recent years, the popularity of coated glasses has occasioned numerous attempts at achieving a coated glass article which, prior to heat treatment, can be coated, and which thereafter, can be heat treated without adversely changing the characteristics of the coating or the glass itself (i.e. the resulting glass article). One of the reasons for this is, for example, that it can be extremely difficult to achieve a uniform coating on an already bent piece of glass. It is well known that if a flat glass surface can be coated and thereafter bent, much simpler techniques can be used to get a uniform coating than if the glass has been previously bent. This is true, in this respect, for architectural and residential glass, but is particularly true for automotive glass such a bent glass windshields which in recent years have had to take on more aerodynamically efficient designs to aid in achieving increased fuel economy.

Certain techniques have been developed in the past for making coated heat treatable glass articles which may then, and thereafter, be heat treated by way of tempering, bending, or a technique known as "heat strengthening". Generally speaking, many of these prior coated articles have suffered from not being heat treatable at the higher, elevated temperatures necessary to achieve economic bending, tempering, and/or heat strengthening (i.e. 1150° F.–1450° F.). In short, such techniques have often suffered from a need to keep the temperature at approximately 1100° F. or less in order to achieve heat treatability without adversely affecting the coating or its substrate.

This latter situation; namely the absence of any substantial adverse affect upon the coating or its substrate, defines what is meant herein by the term "heat treatable". While in certain situations, some characteristics may change somewhat during heat treatment, to be "heat treatable" as used herein means that the desired properties of the ultimate layer system and overall product must be achieved despite the fact that the coated glass has been subjected to one or more of the heat treatments discussed above (i.e. bending, tempering and/or heat strengthening). For most architectural purposes contemplated by this invention optimized heat treatability means that the glass and its layered coating remains substantially unchanged in its visual (optical) appearance as between the pre-heat treated product and the final product after heat treatment. For most automotive purposes change for the better due to the heat treatment may be tolerated and is even desirable, so long as optimized heat treatability means that the change takes place uniformly across the substrate and is independent of the parameters used to perform the heat treatment.

In this respect, U.S. Pat. No. 5,188,887 discloses certain prior art coating systems which are heat treatable because they can be heat treated successfully at the higher, more elevated temperatures aforesaid, to achieve the desired result despite having gone through tempering, bending or heat strengthening. Generally speaking, these prior art coating compositions find their uniqueness in a layering system which employs as a metallic layer, a high nickel content alloy which, in its preferred form, is an alloy known as Haynes 214, consisting essentially of 75.45% Ni, 4.00% Fe, 16.00% cr., 0.04% C, 4.50% Al, and 0.01% Y (percentages are by weight). By using a high nickel content alloy, such as Haynes 214, and overcoating it with stoichiometric tin oxide ($SnO_2$) either alone or with other layers (such as an undercoat of the same stoichiometric tin oxide and/or an intermediate layer of aluminum between the top $SnO_2$ layer and the high content nickel alloy), it was found that heat treatability of glass articles at elevated temperatures of from approximately 1150° F.–1450° F. from about 2–30 minutes, could be achieved without substantial degradation of color, mechanical durability, emissivity, reflectance or transmittance. These compositions therefore constituted a significant improvement over prior heat treatable systems such as those disclosed in the following U.S. Pat. Nos. 4,790,922; 4,816,034; 4,826,525; 4,715,879; and 4,857,094.

In addition to the above disclosures in the aforesaid patents, the Leybold windshield glass system TCC-2000 is also known. In this system, four or five layers of metals and metal oxides are employed to obtain a sputter-coated glass which, being somewhat heat treatable at temperatures up to 1100° F. may be used as a pre-coated glass for making bent or unbent, glass windshields, provided that rapid time limits are placed on the heat treatment. The layering from glass substrate outwardly usually includes a first layer of tin oxide, a second layer of nickel/chrome alloy (usually about 80/20), a third layer of silver, a fourth layer of the nickel/chrome alloy, and a fifth layer of tin oxide. In addition to the rather low upper limit on heat treatment temperature and times, the resultant coatings are rather soft and exhibit such unacceptably low chemical resistance characteristics that they can realistically be used only on the inner surfaces of laminated glass windshields.

In the aforesaid U.S. Pat. No. 4,715,879 it is specifically taught that the layering system therein cannot be achieved unless the protective layer of a metal oxide (e.g. tin oxide) be formed such that the oxide has an oxygen deficit (i.e. is non-stoichiometric). This, of course, requires delicate balancing in the manufacturing process. Heat treatability, in this respect, is also disclosed in U.S. Pat. No. 4,826,525. However, in this patent it is specifically taught that a layer of aluminum must be applied to achieve heat treatability.

In the aforesaid U.S. Pat. No. 5,229,194, a significant advance in heat treatable sputter coatings is disclosed, even when compared to those disclosed in U.S. Pat. No. 5,188,887. In that invention it was found that unique results in the area of heat treatable sputter-coated glasses were achievable, particularly when used as "privacy" windows in vehicles, if metallic nickel or a high content metallic nickel alloy layer were surrounded by an undercoat and overcoat of a separate layer of an oxide or nitride of nickel or high content nickel alloy, and a further overcoat of an oxide such as $SnO_2$, ZnO, $TiO_2$ or oxide alloys thereof was employed. Silicon is also mentioned as useful for the first overcoat of the metallic nickel-containing layer.

Such layering systems in their preferred forms proved particularly heat treatable and abrasion resistant. However, while some were found initially to be chemically resistant, certain systems when put into mass production were found not to pass the rather rigorous 5% HCl boil chemical resistance test (discussed below). Their infrared and UV reflectance characteristics were, however, found to be excellent for a wide range of uses. Still further, however, their visible light transmittance values, desirably low for "privacy" window use, nevertheless proved to be too low to be truly useful as glass windows or panels for architectural or residential purposes where high visible light transmittance is required. Thus when production called for the sputter-coater to fulfill orders for architectural or residential coated glass after glass sheets for "privacy" windows had been coated, the coater had to be shut down so that a new layer system could be formed. If such a shutdown could be avoided a significant economic advance would be accomplished.

In commonly owned U.S. Pat. No. 5,344,718, there are disclosed certain unique sputter-coated layering systems having unique applicability for architectural and residential purposes because of their achievement of not only good chemical and mechanical durability, but their solar management properties as well. These systems are properly deemed "low-E" glasses (coatings) because their hemispherical emissivity ($E_h$) was generally less than about 0.16 and their normal emissivity ($E_n$) was generally less than about 0.12. Measured another way their sheet resistance was preferably less than about 10.50 ohms/square. In addition, for normal glass thicknesses (e.g. 2 mm–6 mm) visible light transmittance was preferably about 78% or more (compared to less than about 22–23% in certain preferred embodiments of the aforesaid heat treatable "privacy" window layer systems).

The invention in the aforesaid U.S. Pat. No. 5,344,718 achieved its unique low-E, high visible light transmittance values, along with its good chemical durability and resistance to abrasion, by employing a layer system which generally comprised (from glass outwardly) an undercoat layer of $Si_3N_4$, a first layer of nickel or nickel alloy, a layer of silver, a second layer of nickel or nickel alloy, and an overcoat layer of $Si_3N_4$. In certain preferred embodiments, the layer system from glass outwardly consisted essentially of:

$Si_3N_4/Ni:Cr/Ag/Ni:Cr/Ag/Ni:Cr/Si_3N_4$

This seven layer system was found to exhibit somewhat higher durability and scratch resistance characteristics than the above-described five layer system. In each system, however, the preferred Ni:Cr layer was nichrome, i.e. 80/20 by weight Ni/Cr, and in which a substantial portion of the chromium formed as a nitride of Cr because the Ni:Cr layer was formed in a nitrogen-containing atmosphere.

Unfortunately, these durable, low-E, high visible transmittance glass layer systems proved to be non-heat treatable. This has now been found to be true not because of any oxidation of the silver layer(s) but because the metallic silver layer(s) during heat treatment become(s) discontinuous due to non-wetting; in this case because the Ni:Cr surrounding layers are insufficient to maintain the continuity of the silver layer(s) during heat treatment. Thus these otherwise advantageous layer systems could not be used where the layered glass was thereafter to be heat treated as by tempering, heat strengthening and bending. Unfortunately the silver layers were necessary to employ in order to achieve the desired low-E levels.

It is to be remembered in this respect that it is not just in the automotive windshield art where heat treatable sputter-coated layer systems find their utility. Certain architectural and residential uses also require the coated glass to be tempered, bent, or heat strengthened. Still further, the low-E glass systems of the aforesaid invention in U.S. Pat. No. 5,344,718 could generally not be adjusted to achieve low enough visible transmittance values to make them useful in "privacy" windows, even if they were heat treatable . . . which they were not. For these reasons then, these low-E glass systems did not overcome the aforesaid production problem of having to shut down the system to satisfy the needs of customers requiring widely varying solar management characteristics in their sputter-coated glass products.

Compounding the above-described problem was the problem created in the sputter-coating chamber by the need to create an $Si_3N_4$ layer or layers in the layering system of the aforesaid U.S. Pat. No. 5,344,718. In order to achieve such a layer, an Si target (usually doped with aluminum) as the cathode was employed. Sputter coating was then conducted in an $N_2$ containing atmosphere to create $Si_3N_4$ by reaction. Unfortunately $Si_3N_4$ is a non-conductor (as is the small amount of aluminum nitride formed from the Al dopant which also coats the anode during sputter-coating). Coating efficiency deteriorates and shutdown times can be extensive.

In commonly owned U.S. Pat. No. 5,403,458, a unique solution to this problem is disclosed. Generally speaking, the solution is to create a cathode target which has a prescribed amount of a conductive metal dispersed in the Si so that its nitride (or the metal if it does not form a nitride during the sputter-coating operation) forms on the anode in sufficient amounts to maintain conductivity for an enhanced period of time, thus avoiding numerous shutdowns. The entire disclosure of this copending application is incorporated herein by reference.

Heretofore if the skilled artisan wished to continue to achieve the known benefits of abrasion and corrosion resistance by using $Si_3N_4$ layers, but also wished to avoid costly downtime, while at the same time needing to achieve heat treatability and yet have flexibility to vary the solar management properties over a reasonably wide range to avoid further production shutdowns (to meet the needs of different customers), that artisan was faced with an unsolvable problem. In this respect, the mere choice of any conductive metal as the dispersant (i.e. dopant) in an Si target would not inherently solve the problem, for that metal, while overcoming the anode coating problem may well defeat heat treatability and/or the desired levels of durability, and/or solar management (including color) characteristics which must be achieved.

It is therefore, apparent that there exists a need in the art for a sputter-coated layer system which achieves the benefits of sputter-coating while overcoming the above-described problems and drawbacks in the art. It is a purpose of this invention to fulfill this need in the art as well as other needs which will become apparent to the skilled artisan once given the following disclosure.

SUMMARY OF THE INVENTION

Generally speaking this invention fulfills the above-described needs in the art by providing a glass article which includes a glass substrate having thereon a sputter-coated layer system comprising from the glass substrate outward, (a) a substantially metallic layer which includes nickel or a nickel alloy and which is substantially free of any nitride; and (b) an overcoat layer of silicon nitride ($Si_3N_4$); and wherein the layers are each of sufficient thickness such that when the glass substrate has a thickness of about 1.5 mm–13 mm and has the aforesaid layer system thereon the so-layered glass article is heat treatable and has a visible transmittance of about 1–80% and a normal emissivity ($E_n$) of about 0.10–0.60. In certain preferred embodiments layer (a) is substantially free of any nitride and the glass article both before and after heat treatment is durable and chemically resistant. In certain further preferred embodiments of this invention the layer system does not contain any layer of silver.

This invention further fulfills the above-described needs in the art by providing a method of heat treating a coated glass article which generally comprises:

a) sputter-coating onto a glass substrate a layer system comprising from the glass substrate outwardly, a substantially metallic layer which includes nickel or a nickel alloy; and an overcoat layer of silicon nitride; and b) thereafter subjecting this coated glass substrate to a heat treatment selected from the group consisting of bending, tempering, heat strengthening and combinations thereof; and c) wherein after this heat treatment the resultant article has a normal emissivity ($E_n$) of about 0.10–0.60 and a visible transmittance of about 1–80%.

In certain preferred embodiments of this invention the layer system further includes an undercoat layer of $Si_3N_4$, and each of the $Si_3N_4$ layers includes a small amount of a dopant conductive metal or conductive metal nitride as a result of the use of such a metal as a dispersant (dopant) in the Si cathode target of the sputter coating apparatus to overcome the above-described problem of downtime due to coating of the anode with non-conductive $Si_3N_4$. The dopant, conductive metal is, of course, chosen so as to, at worst, have no adverse affect upon the solar management or other physical characteristics desired in the final product. In certain preferred systems, this dopant metal is selected from titanium, zirconium, hafnium and mixtures thereof.

The layer systems as aforesaid are preferably formed by sputter coating each layer to its requisite thickness onto a glass substrate. While the glass thickness may be varied widely, typically the glass article will be of the float glass type and have a thickness of about 1.5–13.0 mm (i.e. about 0.060"–0.50") and more usually about 2 mm–6 mm. The glass may be tinted or non-tinted, or patterned glass. Such glass may be of the single strength type. In certain further preferred forms of this invention, then, and when measured by application to a glass substrate having a conventional thickness of about 4.0 mm the resultant glass article, after being heat treated will have the following characteristics:

| Characteristic | Range |
| --- | --- |
| Visible Transmission: | about 1%–80% |
| Visible Reflectance (glass side): | about 4%–55% |
| Visible Reflectance (film side): | about 4%–65% |
| Visible Color (glass side): | silver, pewter, blue, gray |
| Emittance (normal, i.e. $E_n$): | about 0.10–0.60 |
| Sheet Resistance ($R_S$): | about 2–250 ohms/square |
| Solar Transmission: | about 1%–80% |

The above table shows how flexible the systems of this invention are to meet a wide range of solar management needs.

Transmission and Reflectance are recorded as Illuminant C, 2° observer. A more preferred range of Normal Emittance ($E_n$) is about 0.15–0.35 for many uses. A more preferred range of Sheet Resistance is about 15–35 ohms/square for many uses.

In the most preferred forms of this invention the resultant article, and its layer system, both before and after heat treatment exhibits excellent chemical resistance and durability (i.e. abrasion or scratch resistance).

"Chemical resistance" is determined by boiling a 2"×5" sample of the article in about 500 cc of 5% HCl for one hour (i.e. about 220° F.). The article is deemed to pass this test if it shows no pinholes greater than about 0.003" in diameter after this one hour boil. "Durability" is measured by two tests, first a conventional Taber abrader test using a 4"×4" sample and or a 500 g.wt. attached to each of two C.S. 10F abrasion wheels rotated through 300 revolutions. Durability may further be tested using a Pacific Scientific Abrasion Tester (1" nylon brush cyclically passed over the coating in 500 cycles employing 150 gms. of weight, applied to a 6"×17" sample). In both tests if no substantial, noticeable scratches appear when viewed with the naked eye under visible light, the test is deemed passed, and the article is said to be durable.

Transmission properties in the preferred forms of this invention are as indicated above when measured by the conventional Illuminant C, 2° observer test using a glass substrate of about 4 mm. To be "heat treatable" within the meaning of the preferred forms of this invention, transmission (visible and solar) should not be changed by heat treatment more than about 20% and preferably less than about 10%. Most preferably it changes less than about 2%. In addition, to be "heat treatable" within the meaning of the most preferred forms of this invention, sheet resistance ($R_s$) should not be increased more than about 10% during heat treatment. Preferably it is not increased at all, and most preferably it is decreased slightly by such heat treatment.

By way of further explanation of the above characteristics, the terms "emissivity" and "transmittance" are well understood in the art and are used herein according to their well known meaning. Thus, for example, the term "transmittance" herein means solar transmittance, which is made up of visible light transmittance, infrared energy transmittance, and ultraviolet light transmittance. Total solar energy transmittance is then usually characterized as a weighted average of these other values. With respect to these transmittances, visible transmittance, as reported herein, is characterized by the standard Illuminant C technique, 2° observer, at 380–720 nm; infrared is 800–2100 nm; ultraviolet is 300–400 nm; and total solar is 300–2100 nm. For purposes of emissivity, however, a particular infrared range (i.e. 2,500–40,000 nm) is employed, as discussed below.

Visible transmittance can be measured using known, conventional techniques. For example, by using a spectrophotometer, such as a Beckman 5240 (Beckman Sci. Inst. Corp.), a spectral curve of transmission at each wavelength is obtained. Visible transmission is then calculated using ASTM E-308 "Method for Computing the Colors of Objects by Using the CIE System" (*Annual Book of ASTM Standards*, Vol. 14.02). A lesser number of wavelength points may be employed than prescribed, if desired. Another technique for measuring visible transmittance is to employ a spectrometer such as a commercially available Spectragard spectrophotometer manufactured by Pacific Scientific Corporation. This device measures and reports visible transmittance directly.

"Emissivity" (E) is a measure, or characteristic of both absorption and reflectance of light at given wavelengths. It is usually represented by the formula:

$$E = 1 - \text{Reflectance}_{film}$$

For architectural purposes, emissivity values become quite important in the so-called "mid range", sometimes also called the "far range", of the infrared spectrum, i.e. about 2,500–40,000 nm. The term "emissivity", as used herein, is thus used to refer to emissivity values measured in this infrared range as specified by the 1991 Proposed ASTM Standard for measuring infrared energy to calculate emittance, as proposed by the Primary Glass Manufacturers' Council and entitled "Test Method for Measuring and Calculating Emittance of Architectural Flat Glass Products Using Radiometric Measurements". This Standard, and its provisions, are incorporated herein by reference. In this Standard, emissivity is broken into two components, hemispherical emissivity ($E_h$) and normal emissivity ($E_n$).

The actual accumulation of data for measurement of such emissivity values is conventional and may be done by using, for example, a Beckman Model 4260 spectrophotometer with "VW" attachment (Beckman Scientific Inst. Corp.). This spectrophotometer measures reflectance versus wavelength, and from this, emissivity is calculated using the aforesaid 1991 Proposed ASTM Standard which has been incorporated herein by reference.

Another term employed herein is "sheet resistance". Sheet resistance ($R_s$) is a well known term in the art and is used herein in accordance with its well known meaning. Generally speaking, this term refers to the resistance in ohms for any square of a layer system on a glass substrate to an electric current passed through the layer system. Sheet resistance is an indication of how well the layer is reflecting infrared energy, and is thus often used along with emissivity as a measure of this characteristic, so important in many architectural and automotive glasses. "Sheet resistance" is conveniently measured by using a 4-point probe ohmmeter, such as a dispensable 4-point resistivity probe with a Magnetron Instruments Corp. head, Model M-800 produced by Signatone Corp. of Santa Clara, Calif.

This invention will now be described with respect to certain embodiments thereof as discussed below and illustrated in the following drawings, wherein:

IN THE DRAWINGS

| LEGEND | |
|---|---|
| $Si_3N_4$ = | a layer comprised of at least about 90% silicon nitride |
| Ni = | metallic nickel |
| M = | a nickel containing metal layer substantially free of any nitride of that metal |
| M/O = | a layer wherein a very small amount of oxidation of the nickel containing metal layer has taken place, the layer remains substantially free of any nitride of the metal |
| $MO_x$ = | the layer is stoichiometrically oxidized metal |
| glass = | the glass substrate (also "G" in FIG. 7) |
| $W_2$ = | first washer |
| $W_1$ = | second washer |
| T = | tunnel |
| C = | conveyor |
| F = | chamber separator wall | and wherein; FIGS. 1–6 are partial cross-sectional views wherein:

DETAILED DESCRIPTION OF CERTAIN EMBODIMENTS

As contemplated by this invention, the layer systems as illustrated (e.g. FIGS. 1A–6) are heat treatable within the meaning of that term as defined above. As further stated above, in their preferred forms, heat treatment actually may improve the article by increasing its IR reflectance (e.g. as indicated by a reduction in sheet resistance, $R_s$).

It has been found that to achieve this heat treatability, each layer should have a finite thickness which is generally continuous in nature. The thickness of any particular layer or the system as a whole may, so long as each layer is substantially continuous, be varied over a wide range depending upon the material used for the layer, the heat treatment to be used, the number of layers in the system, and the characteristics desired in the ultimate product. Generally speaking, however, the following ranges of thicknesses have been found to give the best results for most contemplated purposes:

|  | Thickness (Å) |
|---|---|
| $Si_3N_4$ (overcoat) | 10–750 |
| M (nickel or nickel alloy) | 50–300 |
| $MO_x$ | 50–100 |
| M/O | 50–500 |
| $Ni/Si_3N_4$ | 50–300 |
| $Si_3N_4$ (intermediate) | 500–1200 |
| $Si_3N_4$ (undercoat) | 10–750 |

An important aspect of this invention is the use of silicon nitride ($Si_3N_4$) as a layer or layers in the system. In this respect various forms of silicon nitride containing materials were heretofore known for use as a coating material capable of providing resistance to abrasion and corrosion in a layer system. See, for example, U.S. Pat. Nos. 4,769,291; 5,062,937; 4,954,232; 4,948,482 and 4,680,742. This invention avails itself of these advantageous properties of an $Si_3N_4$ layer or layers. However, and in addition, it is a unique, and quite surprising, finding of this invention that when such a layer or layers of $Si_3N_4$ is (or are) used in combination with another selected metal(s) to make up a particular group of layer systems, that these layer systems achieve the highly desirable characteristic of being heat treatable as well. Still further, it has also been surprisingly found that, whether through synergism or some other unknown mechanism, $Si_3N_4$ is employed with such selected metal layer(s) to make up these layer systems, a significant improvement in chemical resistance is experienced, particularly as compared with the prior, known and highly regarded high content Ni layer systems of the aforesaid U.S. Pat. No. 5,229,194.

In the practice of this invention it is believed that the metal employed (as M, M/O and/or $MO_x$) in combination with $Si_3N_4$ should be selected from a rather narrow group of alternatives in order to achieve the desired results of heat treatability, durability and chemical resistance, while at the same time achieving the necessary color and solar management properties desired. While such a group is no longer limited to high content nickel alloys as contemplated, for example, in U.S. Pat. Nos. 5,188,887 and 5,229,194, nevertheless, the metal should be either nickel or a nickel containing alloy having at least about 10% by weight nickel because pure nickel is difficult to sputter. A nickel alloy is preferred, and in this respect such alloys preferably include chromium in a sufficient amount to make the system non-magnetic and therefore more sputterable.

In this respect, it is a surprising feature of this invention that the heretofore believed essential limitation of having to use a high content nickel alloy (or pure nickel) to achieve heat treatability is no longer applicable when used in combination with a layer or layers of $Si_3N_4$. While at least one nickel-containing layer is still important to employ, it need not be a high content nickel alloy. It is a requirement, however, for this invention, that while some small or minor amount of oxidation may be tolerated in the nickel-containing layer(s), the nickel-containing layer(s) must remain substantially free of any nitride so as to be sufficiently chemically resistant to satisfy most needs. In this respect, while nitrides do not significantly interfere with the achievement of heat treatability in most instances, the formation of such a nitride has been found to reduce chemical durability as measured by the aforesaid 5% HCl boil test.

As stated above the nickel-containing layer(s) may be substantially all nickel but are more preferably a simple Ni/Cr alloy. An example of one such group of alloys found useful herein are the rather large number of stainless steels having as their nickel content as little as about 10% by weight nickel (e.g. SS-316, which is 10% Ni and 90% other, mainly Fe and Cr). Of course, high content nickel/chromium alloys remain useful in this invention. Such include 80/20 by weight Ni/Cr and Haynes 214 Alloy whose nominal composition by weight consists essentially of:

| Element | (approx) Wt. % |
|---|---|
| Ni | 75.45 |
| Fe | 4.00 |
| Cr | 16.00 |
| C | .04 |
| Al | 4.50 |
| Y | .01 |

Other examples of Ni/Cr alloys useful in the practice of this invention include Inconel and nichrome. Generally speaking, then, the metallic layer(s) used in combination with the $Si_3N_4$ layer(s) as contemplated by this invention include at least about 10% by weight nickel, and at least one of these layers must be present in substantially unoxidized form (or have undergone only a minor amount of oxidation) and is preferably substantially free of a nitride to maximize chemical resistance.

Figure 1A:
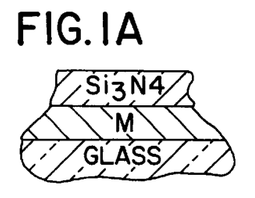
FIG. 1A illustrates a two layer system according to this invention.
Figure 1B:
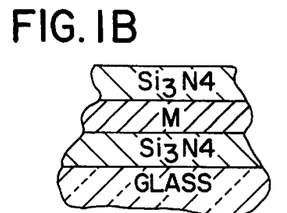
FIG. 1B illustrates the layer system of FIG. 1A with a silicon nitride undercoat.

With reference now to the drawings, FIGS. 1A and 1B illustrate one particular type of heat treatable layer system contemplated herein. In these two figures, a nickel containing metal "M" virtually free of any oxidation or nitride has been formed by sputter coating (e.g. to a thickness of about 50 to 300 Å). In FIG. 1A this metallic layer is simply overcoated by sputter coating with $Si_3N_4$ (e.g. about 10 to 750 Å thick). In FIG. 1B an undercoat of $Si_3N_4$ was first sputter coated onto the glass substrate (e.g. to a thickness of about 10 to 750 Å).

Figure 2A:
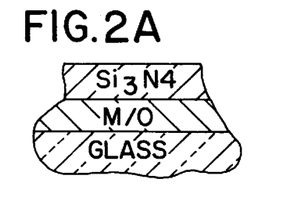
FIG. 2A illustrates another two layer system according to this invention.
Figure 2B:
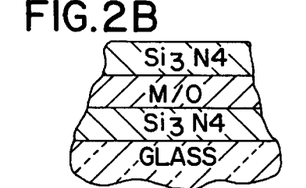
FIG. 2B illustrates the layer system of FIG. 2A with a silicon nitride undercoat.

The layer system of FIG. 2A is similar to that of FIG. 1A and the layer system of FIG. 2B is similar to that of FIG. 1B except that, by the designation "M/O" it is indicated that an acceptable heat treatable layer system can be achieved despite the existence of a small amount of oxidation having been formed in the metallic layer. While not precisely quantifiable, in certain instances as much as about 15% oxygen in the sputter-coating gas may be tolerated and still achieve the desired results of this invention. The layer thicknesses here are the same as in FIGS. 1A and 1B respectively.

Figure 3A:
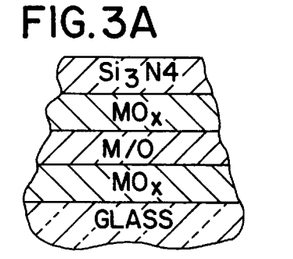
FIG. 3A illustrates a four layer system according to this invention.
Figure 3B:
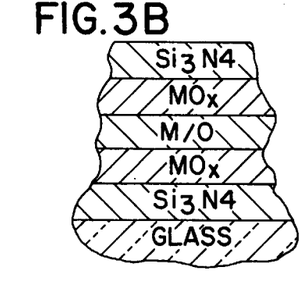
FIG. 3B illustrates the layer system of FIG. 3A with a silicon nitride undercoat.

FIGS. 3A and 3B show a family of layer systems in accordance with this invention. Here, whether only overcoated with $Si_3N_4$ (FIG. 3A) or in addition, undercoated as well with $Si_3N_4$ (FIG. 3B) stoichiometric metal oxide layers $MO_x$ surround the substantially metallic layer M/O. The layers are sputter coated to the thicknesses within the guidelines given above.

Figure 4A:
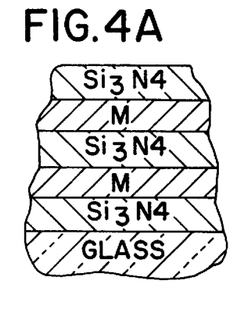
FIG. 4A illustrates a five layer system according to this invention.
Figure 4B:
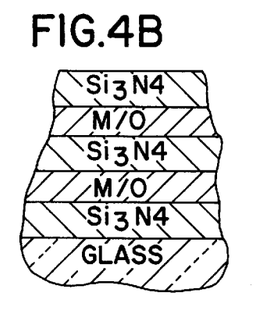
FIG. 4B illustrates the five layer system of FIG. 4A wherein the metal "M" is partially oxidized.

FIGS. 4A and 4B illustrate yet another family of layer systems contemplated by this invention. Here two layers of metal "M", or slightly oxidized metal "M/O" are separated, and surrounded by layers of $Si_3N_4$. Once again, the layers are sputter coated to thicknesses within the guidelines given above.

Figure 6:
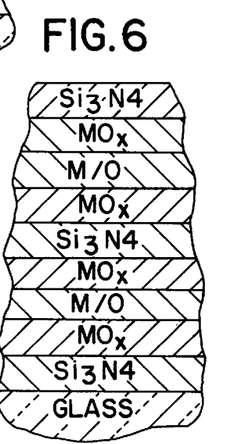
FIG. 6 illustrates a nine layer system according to this invention.

FIG. 6 is a combined hybrid of the families of FIGS. 3A,B and 4A,B, in that here there are two metallic layers M/O, each surrounded by stoichiometric oxide layers $MO_x$ which in turn are surrounded by three layers, $Si_3N_4$. Again the layers are sputter coated to thicknesses within the guidelines given above.

Figure 5A:
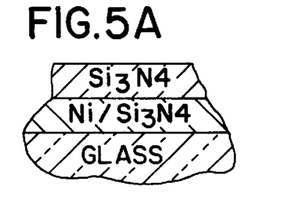
FIG. 5A illustrates another two layer system according to this invention.
Figure 5B:
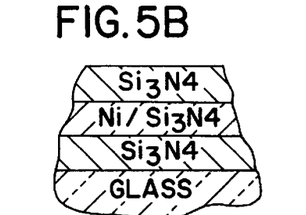
FIG. 5B illustrates the two layer system of FIG. 5A with a silicon nitride undercoat.

FIGS. 5A and 5B set forth another family of layer systems according to this invention. Here the metallic layer is overcoated (alone, FIG. 5A) or optionally undercoated as well (FIG. 5B) with $Si_3N_4$ as in the other families. However, in this embodiment substantially pure nickel has been admixed with $Si_3N_4$ as the separate metal layer. This intermediate $Ni/Si_3N_4$ layer uniquely serves in certain circumstances to achieve desired solar management characteristics yet is highly durable, heat treatable, and abrasion resistant. The weight percent of Ni in the preferred embodiments is about 80 to 90%, the remainder being $Si_3N_4$.

The layer systems of this invention may be formed by any conventional sputter-coating technique, using for example, a conventional sputter coater such as an Airco-Temescal multi-zone sputter coater of known design. One preferred way, however, of forming the coatings of this invention is to use the unique techniques and targets as disclosed in aforesaid U.S. Pat. No. 5,403,458. Generally speaking, and as disclosed in this copending application, a unique sputter-coated target for producing $Si_3N_4$ layers is employed to overcome the problem of coating the anode with a non-conductive layer (e.g. of $Si_3N_4$). This is accomplished by uniformly mixing with the Si of the target another element, in small quantities, which will render the ultimate layer formed (and thus the layer formed on the anode) conductive . . . thereby alleviating the anode reconditioning downtime problem prevalent in the art.

In the practice of the subject invention where heat treatability, solar management, durability and abrasion resistance are desired characteristics in the layer system, care must be taken in choosing the conductive element to be admixed with the Si in the target so as not to defeat, in the ultimate $Si_3N_4$ layer formed, its purposes and characteristics. Thus, in the practice of this invention it is preferred for most systems contemplated that the conductive element used will be limited to small amounts, usually less than abut 10% and preferably less than about 5%. Such elements furthermore should generally be highly resistant to oxidation. Metals such as gold, platinum and nickel may be employed. Preferred, however, for most purposes contemplated herein are the metals titanium, zirconium, chromium, hafnium, and mixtures thereof. These elements are preferred because they generally form nitrides which are electrically conductive and, optically as well as mechanically, do not interfere (and are compatible with) the primary material $Si_3N_4$. To the extent they form nitrides, however, the amount of such a nitride formed is to be minimized. To the extent that any silicide is formed of these metals it is believed that it is an intermediate which quickly breaks down into its respective nitrides, but in any event is compatible with and does not optically or mechanically interfere with the $Si_3N_4$ is any event, to the extent that it may remain.

A particularly preferred target for use herein is an Si target doped with about 5% titanium. It has been found that the resultant layer(s) formed (e.g. the $Si_3N_4$ illustrated in FIGS. 1–6) comprise(s) about 95% $Si_3N_4$, the remainder being titanium nitride. This small amount of titanium nitride has been found not to interfere materially with the optical, mechanical, chemical, color or heat treatable characteristics desired in the practice of this invention. In like manner, furthermore, the nitride of zirconium, chromium or hafnium can also be tolerated for the purposes of achieving production efficiency in approximately the same amounts.

This invention will now be described with respect to certain examples thereof:

EXAMPLES

The following layer systems were sputter coated onto clear glass substrates using Si target(s) (doped with 5% aluminum) and conventional sputter coating techniques as indicated. The chemical and durability tests employed are as described above. The heat treatment employed exemplified a typical tempering process by subjecting the sample to 1265° F. (685° C.) for 5 minutes. Heat treatment samples were either 3"×3" or 4"×4" squares.

Example 1

Prior Art Exemplar

A layer system of a prior art exemplar such as falls within the scope of our aforesaid U.S. Pat. No. 5,229,194, was formed by sputter coating. The layer system so formed from glass outward was $SnO_2/MO_x/M/O/MO_x/SnO_2$ wherein M=Haynes 214 Alloy. The product showed excellent heat treatability and an $R_s$ of 79 ohms/sq. However, it failed the chemical resistance test (i.e. 5% HCl boil at 220° F. for 1 hour) before heat treatment at 5 minutes and at 12 minutes after heat treatment. The Taber abrasion test was passed in that there was a 7.6% change in transmission prior to heat treatment at 300 revolutions, but only a 1.2% change in transmission after heat treatment at 300 revolutions. This evidenced quite acceptable mechanical durability characteristics. Despite its somewhat low chemical resistance as determined by the boil test, this prior art coating system has proven to be an excellent heat treatable coating for many applications where very reduced visible transmission is required, and this kind of chemical resistant is of little or no concern. An example of such use is in "privacy" windows in automobiles. In this respect visible transmittance of this prior art exemplary is about 23%.

Examples 2–24

A series of layered films was now made for comparison purposes using standard sputter coating techniques and thicknesses within the above guidelines. The results are as follows:

| Example No. | Layer System | Heat Treatment | Acid Boil |
|---|---|---|---|
| 2 | $SNO_2/214OX/214-0/214OX/SNO_2/Si_3N_4$ | F | F |
| 3 | $SNO_2/214OX/214-0/214OX/Si_3N_4$ | P | P |
| 4 | $SNO2/214OX/214-0/214OX/Si_3N_4/SNO_2$ | | PP |
| 5 | $Si_3N_4/214OX/214-0/214OX/Si_3N_4$ | P | P |
| 6 | $Si_3N_4/214/Si_3N_4$ | P | P |
| 7 | $Si_3N_4/214-N/Si_3N_4$ | P | F |
| 8 | $Si_3N_4/214-N/Si_3N_4$ | P | F |
| 9 | $Si_3N_4/214-N/Si_3N_4$ | P | F |
| 10 | $Si_3N_4/214/Si_3N_4$ | P | P |
| 11 | $Si_3N_4/214OX/214-0/214OX/Si_3N_4$** | | |
| 12 | $Si_3N_4/214/Si_3N_4/214/Si_3N_4$ | | PP |
| 13 | $Si_3N_4/214/Si_3N_4/214/Si_3N_4$ | | PP |
| 14 | $Si_3N_4/214OX/214-0/214OX/Si_3N_4/$ $214OX/214-0/214OX/Si3N_4$ | P | P |
| 15 | $Si_3N_4/214OX/214-0/214OX/Si_3N_4/$ $214OX/214-0/214OX/Si_3N_4$ | P | P |

-continued

| Example No. | Layer System | Heat Treatment | Acid Boil |
|---|---|---|---|
| 16 | $Si_3N_4/214$-$0/Si_3N_4$ | P | P |
| 17 | ***$Si_3N_4/Ni/Si_3N_4$ | P | P |
| 18 | $Si_3N_4/Ni/Si_3N_4/Ni/Si_3N_4$ | P | P |
| 19 | $Si_3N_4/Ni/Si_3N_4/Ni/Si_3N_4$ | P | P |
| 20 | $Si_3N_4/SS$-$316/Si_3N_4$ | P | — |
| 21 | $Si_3N_4/SS$-$316/SNO_2$ | F | — |
| 22 | $Si_3N_4/(80/20)/Si_3N_4$ | P | P |
| 23 | ****$Si_3N_4/(80/20)$-$0/Si_3N_4$ | P | P |
| 24 | $Si_3N_4/(80/20)$-$0/Si_3N_4$ | P | P |

*P = Passed test
*PP = Passed test both before and after heat treatment
*F = Failed test
**This layer system was tested and passed the Taber test both before and after heat treatment
***This layer system exhibited low emittance characteristics ($E_n$ = 17)
****80/20 is an alloy of 80% Ni and 20% Cr by weight Examples 22–24 in the above table (reported here as 2A, B, C) were formed in the following way on an ILS-1600 Airco sputter coater using 5/32" clear glass. The following conditions were employed:

| | | Base | GAS 1: Ar | | GAS 2: $N_2$ ($O_2$) | |
|---|---|---|---|---|---|---|
| Line No. | Film Layer | Pressure IG | Flow (scc) | Cap. Mono. | Flow (sccm) | Cap. Mono. |
| 1 | $Si_3N_4$ | $4.1 \times 10^{-6}$ | 25 | $5.5 \times 10^{-4}$ | 25 | $8.8 \times 10^{-4}$ |
| 2A | 80/20 | $2.0 \times 10^{-6}$ | 40 | $6.9 \times 10^{-4}$ | | |
| 2B | 80/20-0 | $1.5 \times 10^{-6}$ | 40 | $7.1 \times 10^{-4}$ | 3 ($O_2$) | $7.5 \times 10^{-4}$ |
| 2C | 80/20-0 | $2.0 \times 10^{-6}$ | 40 | $7.1 \times 10^{-4}$ | 6 ($O_2$) | $7.8 \times 10^{-4}$ |
| 3 | $Si_3N_4$ | $2.5 \times 10^{-6}$ | 25 | $5/8 \times 1.^{-4}$ | 25 | $9.0 \times 10^{-4}$ |

| | | Drive | Cathode Parameters | | | | | |
|---|---|---|---|---|---|---|---|---|
| Line No. | Film Layer | Motor Speed % | % Power Level | Voltage Load Lock | Power KW | DC AMPS | Voltage Under Cathode | Sputter Pressure IG 1 |
| 1 | $Si_3N_4$ | 35 × 16 | 7.0 | 420 | 2.9 | 7.0 | 424 | $5.5 \times 10^{-4}$ |
| 2A | 80/20 | 35 × 2 | 8.5 | 473 | 4.0 | 8.7 | 477 | $5.0 \times 10^{-4}$ |
| 2B | 80/20-0 | 35 × 2 | 8.5 | 486 | 4.2 | 8.7 | 490 | $5.3 \times 10^{-4}$ |
| 2C | 80/20-0 | 35 × 2 | 8.5 | 501 | 4.2 | 8.7 | 503 | $5.0 \times 10^{-4}$ |
| 3 | $Si_3N_4$ | 35 × 8 | 7.0 | 424 | 2.9 | 7.0 | 426 | $5.7 \times 10^{-4}$ |

Example 24 had an $E_n$ (at 10 microns) before heat treatment of 0.34 and an $R_s$ of 58.1. After heat treatment the $R_s$ was 28.0 and the $E_n$ was 0.23. Illuminant C 2° observer values before and after heat treatment were as follows:

Before heat treatment:

| TY 19.42 | RGY 16.11 | RFY 34.48 |
|---|---|---|
| x .2873 | x .3259 | x .3459 |
| y .2967 | y .3255 | y .3556 |
| a −1.24 | a −1.87 | a −0.96 |
| b −6.77 | b −3.53 | b +15.11 |

After heat treatment:

| TY 26.28 | RGY 12.61 | RFY 28.36 |
|---|---|---|
| x .2869 | x .3209 | x .3558 |
| y .2986 | y .3173 | y .3641 |
| a −2.17 | a +2.58 | a −0.41 |
| b −7.04 | b +1.19 | b +17.54 |

All three products were found to be heat treatable, durable and chemically resistant.

Example 17 in the above table was formed in a similar fashion using 5/32" clear glass with slight variations in operating conditions as indicated below so as to make up three samples a, b, c. The sputtering of the Ni layer included a startup with 10% $O_2$ with heatup for 10 minutes, then shutoff. All samples were heat treatable, chemically resistant and durable. The operating conditions were as follows:

| | | Base | GAS 1: Ar | | GAS 2: $N_2$ | |
|---|---|---|---|---|---|---|
| Line No. | Film Layer | Pressure IG | Flow (sccm) | Cap. Mono. | Flow (sccm) | Cap. Mono. |
| 1 | $Si_3N_4$ | $7.8 \times 10^{-6}$ | 25 | $4.8 \times 10^{-4}$ | 25 | $7.1 \times 10^{-4}$ |
| 2a | Ni | $6.0 \times 10^{-6}$ | 80 | $1.6 \times 10^{-3}$ | | |
| 2b | Ni | $8.4 \times 10^{-6}$ | 80 | $1.6 \times 10^{-3}$ | | |
| 2c | Ni | $2.2 \times 10^{-6}$ | 80 | $1.6 \times 10^{-3}$ | | |
| 3 | $Si_3N_4$ | $8.4 \times 10^{-6}$ | 25 | $5.4 \times 10^{-4}$ | 25 | $8.2 \times 10^{-4}$ |

| | | Drive | Cathode Parameters | | | | | |
|---|---|---|---|---|---|---|---|---|
| Line No. | Film Layer | Motor Speed % | % Power Level | Voltage Load Lock | Power KW | DC AMPS | Voltage Under Cathode | Sputter Pressure IG 1 |

-continued

| 1 | $Si_3N_4$ | 35 × 16 | 7.0 | 422 | 2.9 | 7.0 | 425 | $4.5 \times 10^{-4}$ |
| 2a | Ni | 35 × 1 | 8.5 | 562 | 5.3 | 9.5 | 564 | $8.8 \times 10^{-4}$ |
| 2b | Ni | 35 × 2 | 6.0 | 543 | 3.8 | 7.0 | 545 | $8.9 \times 10^{-4}$ |
| 2c | Ni | 35 × 2 | 7.0 | 547 | 4.1 | 7.5 | 550 | $7.5 \times 10^{-4}$ |
| 3 | $Si_3N_4$ | 35 × 8 | 7.0 | 429 | 2.9 | 7.0 | 428 | $4.3 \times 10^{-4}$ |

For Example 17, sample C, the illuminant C 2° obs. values were determined both before and after heat treatment and were reported as follows:

| Before heat treatment: | | |
|---|---|---|
| TY 23.48 | RGY 12.74 | RFY 31.94 |
| x .2847 | x .3369 | x .3418 |
| y .2948 | y .33444 | y .3499 |
| a −1.56 | a −2.27 | a −0.47 |
| b −7.97 | b +6.02 | b +12.77 |
| After heat treatment: | | |
| TY 22.44 | RGY 14.45 | RFY 32.41 |
| x .2835 | x .3370 | x .3390 |
| y .2932 | y .3367 | y .3461 |
| a −1.41 | a +1.78 | a −0.17 |
| b −8.37 | b +6.72 | b +11.48 |

Sheet resistance $R_s$ before heat treatment was 23.5 and after heat treatment was 17.0. Normal emittance ($E_n$) before heat treatment was 0.24 and after heat treatment was 0.17. Example 17 was heat treatable, durable and chemically resistant.

With reference now to Example 11, in the above table, an 8″×8″ sample of 5/32″ thick clear glass was formed by the sputter coater under the following conditions:

Sheet resistance before heat treatment was 82.6 and after heat treatment was 46.1. Normal emittance ($E_n$) before heat treatment was 0.48 and after heat treatment was 0.33. Before and after Ill. C 2° observer data was reported as follows:

| Before heat treatment: | | |
|---|---|---|
| TY 26.04 | RGY 12.29 | RFY 29.27 |
| x .2869 | x .3319 | x .3436 |
| y .2958 | y .3327 | y .3527 |
| a −1.17 | a +1.40 | a −0.74 |
| b −7.76 | b +5.15 | b +13.30 |
| After heat treatment: | | |
| TY 28.34 | RGY 11.54 | RFY 26.69 |
| x .2895 | x .3321 | x .3395 |
| y .2988 | y .3341 | y .3472 |
| a −1.34 | a +1.09 | a −0.31 |
| b −6.88 | b +5.32 | b +11.09 |

The Taber test prior to heat treatment showed a change of 7.6%. After heat treatment the change was only 1.2%. The product produced was heat treatable, durable and chemically resistant.

Examples 12 and 13, from the above table, were formed in a similar fashion and showed superior heat treatability characteristics and excellent chemical resistance. Example 12 was dark and Example 13 was not. The operating conditions were as follows:

| | | Base | Gas 1: Ar | | Gas 2: N2 | | Gas 3: O2 | |
|---|---|---|---|---|---|---|---|---|
| Line No. | Film Layer | Pressure IG I | Flow (sccm) | Cap. Mono. | Flow (sccm) | Cap. Mono. | Flow (sccm) | Cap. Mono. |
| 1 | $Si_3N_4$ | $32 \times 10^{-6}$ | 25 | $4.7 \times 10^{-4}$ | 25 | $8.0 \times 10^{-4}$ | | |
| 2 | 214OX | $1.3 \times 10^{-6}$ | 10 | $1.4 \times 10^{-4}$ | | | 40 | $5.2 \times 10^{-4}$ |
| 3 | 214-O | $2.6 \times 10^{-6}$ | 40 | $64 \times 10^{-4}$ | | | 3 | $6.4 \times 10^{-4}$ |
| 4 | 214OX | $1.4 \times 10^{-6}$ | 10 | $1.4 \times 10^{-4}$ | | | 40 | $5.3 \times 10^{-4}$ |
| 5 | $Si_3N_4$ | $3.2 \times 10^{-6}$ | 25 | $4.7 \times 10^{-4}$ | 25 | $8.0 \times 10^{-4}$ | | |

| | | | Cathode Parameters | | | | | |
|---|---|---|---|---|---|---|---|---|
| Line No. | Film Layer | Drive Motor Speed % | % Power Level | Voltage Load Lock | Power KW | DC AMPS | Voltage under Cathode | Sputter Pressure IG I |
| 1 | $Si_3N_4$ | 35 × 16 | 7.0 | 429 | 3.0 | 7.0 | 430 | $5.3 \times 10^{-4}$ |
| 2 | 214OX | 35 × 2 | 7.0 | 333 | 2.4 | 7.0 | 335 | $3.6 \times 10^{-4}$ |
| 3 | 214-O | 35 × 2 | 8.5 | 427 | 3.9 | 9.1 | 429 | $3.9 \times 10^{-4}$ |
| 4 | 214OX | 35 × 2 | 7.0 | 332 | 2.3 | 7.0 | 335 | $3.6 \times 10^{-4}$ |
| 5 | $Si_3N_4$ | 35 × 8 | 7.0 | 430 | 3.0 | 7.0 | | |

| Line No. | Film Layer | Base Pressure IG I | Gas 1: Ar Flow (sccm) | Gas 1: Ar Cap. Mono. | Gas 2: N2 Flow (sccm) | Gas 2: N2 Cap. Mono. |
|---|---|---|---|---|---|---|
| 1 | $Si_3N_4$ | $3.4 \times 10^{-6}$ | 25 | $4.7 \times 10^{-4}$ | 25 | $8.0 \times 10^{-4}$ |
| 2 | 214 | $1.6 \times 10^{-6}$ | 40 | $6.0 \times 10^{-4}$ | | |
| 3 | $Si_3N_4$ | $1.3 \times 10^{-6}$ | 25 | $4.6 \times 10^{-4}$ | 25 | $8.0 \times 10^{-4}$ |
| 4 | 214 | $1.1 \times 10^{-6}$ | 40 | $6.3 \times 10^{-4}$ | | |
| 5 | $Si_3N_4$ | $9.8 \times 10^{-7}$ | 25 | $5.0 \times 10^{-4}$ | 25 | $8.2 \times 10^{-4}$ |

| | | Cathode Parameters | | | | | |
|---|---|---|---|---|---|---|---|
| Line No. | Film Layer | Drive Motor Speed % | % Power Level | Voltage Load Lock | Power KW | DC AMPS | Voltage under Cathode | Sputter Pressure IG I |
| 1 | $Si_3N_4$ | 35 × 16 | 7.0 | 430 | 3.0 | 7.1 | 432 | $4.8 \times 10^{-4}$ |
| 2A | 214 | 35 × 2 | 5.0 | 396 | 2.6 | 6.4 | 401 | $3.9 \times 10^{-4} - 4.0$ |
| 2B | 214 | 35 × 2 | 4.3 | 376 | 1.8 | 4.6 | 379 | $4.1 \times 10^{-4}$ |
| 3 | $Si_3N_4$ | 35 × 8 | 7.0 | 431 | 3.0 | 7.0 | 434 | $4.6 \times 10^{-4}$ |
| 4A | 214 | 35 × 2 | 5.0 | 398 | 2.6 | 6.4 | 397 | $3.9 \times 10^{-4} - 4.0$ |
| 4B | 214 | 35 × 2 | 4.3 | 376 | 1.8 | 4.6 | 379 | $4.1 \times 10^{-4}$ |
| 5 | $Si_3N_4$ | 35 × 8 | 7.0 | 431 | 3.0 | 7.0 | 433 | $4.8 \times 10^{-4}$ |

Example 25

Figure 7:
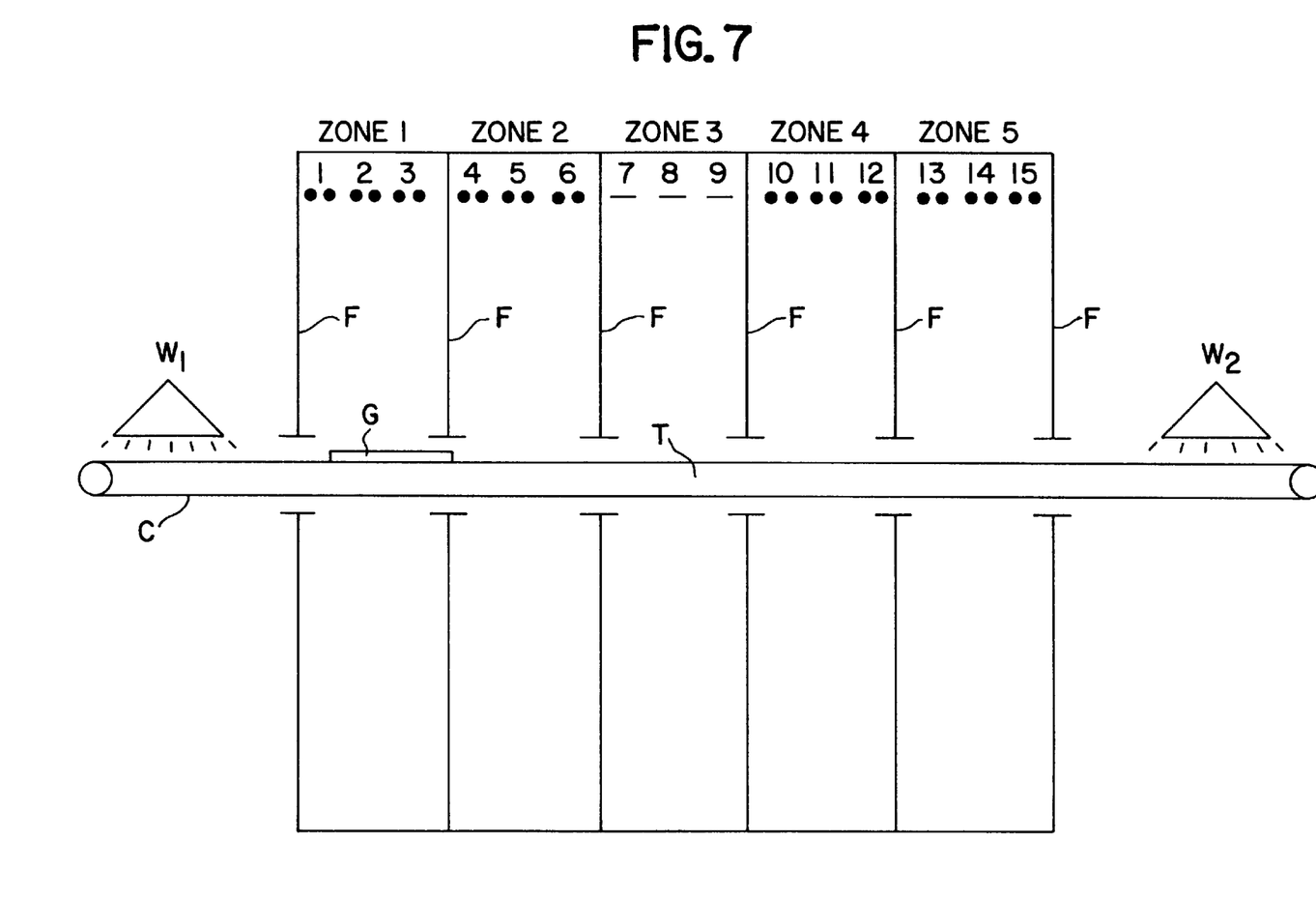
FIG. 7 is a schematic illustration of a conventional Airco 5-chamber sputter coater useful in making the coated glass articles of this invention.

A coated glass article useful for architectural or automotive purpose was formed on a production sputter coater using a typical 5/32" float glass and Haynes 214 as the metal "M". FIG. 1B represents the resultant layer system wherein the $Si_3N_4$ undercoat was approximately 550 Å thick, the Haynes 214 layer was approximately 100 Å thick and the $Si_3N_4$ overcoat was approximately 275 Å thick. A conventional Airco (Solar Products)-Temescal Multi-Zone Architectural Sputter Coater as illustrated in FIG. 7 was employed, and whose various parts are described in more detail in Example 26 below. The operating conditions were as follows:

| Coat Zone | Cathode # | Material | Volts | Amps | P (KW) |
|---|---|---|---|---|---|
| 1 | 1 | Si | 417 | 60.7 | 25.3 |
| | 2 | Si | 428 | 97.7 | 41.8 |
| | 3 | Si | 412 | 97.0 | 40.0 |
| | 4 | Si | 419 | 69.8 | 29.2 |
| | 5 | Si | 409 | 90.0 | 36.8 |
| | 6 | Si | 448 | 92.9 | 41.6 |
| 2 | 7 | Si | 415 | 70.7 | 29.3 |
| | 8 | Si | 417 | 42.5 | 17.7 |
| | 9 | Si | 431 | 86.3 | 37.2 |
| | 10 | Si | 416 | 81.6 | 33.9 |
| | 11 | Si | 420 | 86.3 | 36.2 |
| | 12 | Si | 430 | 90.4 | 38.8 |
| 3 | 31 | 214 | 469 | 36.9 | 17.3 |
| | 32 | 214 | 462 | 36.7 | 17.0 |
| | 33 | 214 | 463 | 36.1 | 16.7 |
| 4 | 19 | 214 | 426 | 18.9 | 8.1 |
| 5 | 25 | Si | 402 | 30.9 | 12.4 |
| | 26 | Si | 43 | 66.1 | 28.6 |
| | 27 | Si | 410 | 75.1 | 30.8 |
| | 28 | Si | 418 | 49.9 | 20.9 |
| | 29 | Si | 452 | 7.8 | 32.0 |
| | 30 | Si | 424 | 71.3 | 30.2 |

| ZONE 1 | |
|---|---|
| Gases | Argon and nitrogen |
| Gas Ratio | 80% $N_2$; 20% Ar |
| Gas Flows | 1448 $N_2$, 365 Ar |
| Throttles | 10% |
| Flow Ratio | A  B  C  D  E |
| | 21  29  0  29  21  (%) |
| Pressure | $2.0 \times 10^{-3}$ Torr |

-continued

| ZONE 2 | |
|---|---|
| Gases | Argon and nitrogen |
| Gas Ratio | 80% $N_2$; 20% Ar |
| Gas Flows | 1856 $N_2$, 433 Ar |
| Throttles | 9% |
| Flow Ratio | A  B  C  D  E |
| | 24  26  0  26  24  (%) |
| Pressure | $2.1 \times 10^{-3}$ Torr |
| ZONES 3 AND 4 | |
| Gases | Argon (100%) |
| Gas Flow | 1821 sccm Ar |
| Throttles | 17% |
| Flow Ratio | A  B  C  D  E |
| | 20  20  20  20  20  (%) |
| Pressure | $2.0 – 2.1 \times 10^{-3}$ Torr |
| ZONE 5 | |
| Gases | Argon and nitrogen |
| Gas Ratio | 80% $N_2$; 20% Ar |
| Gas Flows | 1421 $N_2$, 312 Ar |
| Throttles | 14% |
| Flow Ratio | A  B  C  D  E |
| | 19  31  0  31  19  (%) |
| Pressure | $2.2 \times 10^{-3}$ Torr |

The resultant product was tested and the results are reported as follows:

I. (a) visible transmittance (Ill. C. 2° observer):

| | |
|---|---|
| before heat treatment | 23% |
| after heat treatment | 22% |
| (b) reflectance: | |
| before heat treatment | |
| glass side: | ≈15–16% |

-continued

|  |  |
|---|---|
| film side: | ≈22–24% |
| after heat treatment |  |
| glass side: | ≈14–15% |
| film side: | ≈17–18% |
| (c) emittance ($E_n$): |  |
| before heat treatment | 0.50 |
| after heat treatment | 0.55 |
| (d) sheet resistance (ohms per sq.): |  |
| before heat treatment | 60.0 |
| after heat treatment | 73.5 |
| II. Durability (mechanical) (Taber test only) |  |
| before heat treatment | 8–9% |
| after heat treatment | 5–6% |
| III. Chemical resistance (boil test) |  |
| before heat treatment | pass |
| after heat treatment | pass |

Example 26

A conventional Airco (Solar Products) Temescal multi-zone architectural sputter-coater of known design is used. This coater is schematically illustrated in FIG. 7. In Coating Zones 1, 2, 4 and 5 there are employed three cathodes, each with two rotatable targets. In Coating Zone #3 there are employed three cathodes, each with one planar target. Thus the resulting targets are 1–27 (e.g. Coating Zone #1, Cathode Bay #1, Target "1") Glass substrate G, herein shown as a flat glass sheet (e.g. in the shape of a flat, yet to be bent and/or tempered part) is conveyed on a roller through the Airco sputter-coater whose zones are separated in a known fashion by walls (F) having in their lower extremity an adjustable tunnel (T). Pre-wash ($W_1$) and post-wash ($W_2$) are conventionally provided.

Using this equipment the layer system of FIG. 1B was formed, wherein metal "M" is a substantially pure metallic nickel/chromium alloy (80/20% by wt. Ni:Cr). All 12 targets in Coating Zones #1 and #2 are of the same metal (e.g. silicon doped with about 5% Al) from which a silicon nitride layer was formed. In this case, Zone 1 and Zone 2 were regulated to approximately 2–3 microns (2–3×10$^{-3}$ Torr) with an 80% $N_2$ and 20% Argon atmosphere. As Glass G progressed through Zones #1 and #2 at the aforesaid pressure, silicon nitride was applied to the glass as layer "A" to a thickness of approximately 500 Å.

As glass (G) progresses into Coating Zone #3, cathodes 7, 8 and 9 sputter a layer of the pure metallic nickel chrome alloy (80–20) in Argon at a pressure of 1–2 microns (1–2× 10$^-$Torr). The thickness achieved was approximately 150 Å.

Glass (G) was then moved through Coating Zone #4, which was regulated to a pressure of about 2–3 microns (2–3×10$^{-3}$ Torr) with an 80% $N_2$ and 20% Ar atmosphere. Cathodes 10, 11 and 12 (six metallic silicon targets) were used to apply a layer of silicon nitride. The glass was then moved through Coating Zone #5, which was also regulated to a pressure of approximately 2–3 microns (2–3×10$^{-3}$ Torr) with an 80% $N_2$ and 20% Ar atmosphere. To apply further silicon nitride, a total of six targets are used in this coat zone. All silicon targets were 95% Si, 5% Al, by weight. The total thickness of the overcoat layer of $Si_3N_4$ created in Zones 4 and 5 was approximately 300 Å. This then completes the heat treatable coating system.

The process conditions are as follows:

| Zone | Cathode | Target | KW | Cathode Volts | Amps | Material | Pressure | Material $N_2$ %/Ar % |
|---|---|---|---|---|---|---|---|---|
| 1 | 1 | 1 | 32.1 | 416 | 70.9 | Si | 2.1 × 10$^{-3}$ Torr | 80/20 |
|  | 1 | 2 | 19.8 | 401 | 42.9 | Si | 2.1 × 10$^{-3}$ Torr | 80/20 |
|  | 2 | 3 | 27.6 | 402 | 60.0 | Si | 2.1 × 10$^{-3}$ Torr | 80/20 |
|  | 2 | 4 | 26.9 | 400 | 60.8 | Si | 2.1 × 10$^{-3}$ Torr | 80/20 |
|  | 3 | (5) | x | x | x | Si | 2.1 × 10$^{-3}$ Torr | 80/20 |
|  | 3 | (6) | x | x | x | Si | 2.1 × 10$^{-3}$ Torr | 80/20 |
| 2 | 4 | 1 | 26.5 | 396 | 60.8 | Si | 2.0 × 10$^{-3}$ Torr | 80/20 |
|  | 4 | 2 | 34.8 | 407 | 74.8 | Si | 2.0 × 10$^{-3}$ Torr | 80/20 |
|  | 5 | 3 | 36.0 | 449 | 76.8 | Si | 2.0 × 10$^{-3}$ Torr | 80/20 |
|  | 5 | 4 | 39.6 | 412 | 88.5 | Si | 2.0 × 10$^{-3}$ Torr | 80/20 |
|  | 6 | 5 | 44.6 | 421 | 97.8 | Si | 2.0 × 10$^{-3}$ Torr | 80/20 |
|  | 6 | 6 | 46.7 | 449 | 93.7 | Si | 2.0 × 10$^{-3}$ Torr | 80/20 |
| 3 | 7 | 1 | 11.1 | 436 | 25.5 | 80 Ni 20 Cr | 1.5 × 10$^{-3}$ Torr | 100% Argon |
|  | 8 | 2 | 11.1 | 456 | 25.4 | 80 Ni 20 Cr | 1.5 × 10$^{-3}$ Torr | 100% Argon |
|  | 9 | 3 | 10.9 | 442 | 24.8 | 80 Ni 20 Cr | 1.5 × 10$^{-3}$ Torr | 100% Argon |

-continued

| Zone | Cathode | Target | KW | Cathode Volts | Amps | Material | Pressure | Material $N_2$ %/Ar % |
|---|---|---|---|---|---|---|---|---|
| 4 | 10 | 1 | 18.4 | 410 | 41.0 | Si | $2.1 \times 10^{-3}$ Torr | 80/20 |
|   | 10 | 2 | 18.2 | 410 | 40.0 | Si | $2.1 \times 10^{-3}$ Torr | 80/20 |
|   | 11 | 3 | 17.2 | 409 | 39.5 | Si | $2.1 \times 10^{-3}$ Torr | 80/20 |
|   | 11 | 4 | 17.8 | 411 | 39.6 | Si | $2.1 \times 10^{-3}$ Torr | 80/20 |
|   | 12 | 5 | 18.1 | 407 | 39.5 | Si | $2.1 \times 10^{-3}$ Torr | 80/20 |
|   | 12 | 6 | 18.4 | 403 | 40.4 | Si | $2.1 \times 10^{-3}$ Torr | 80/20 |
| 5 | 13 | 1 | 20.7 | 38.7 | 46.6 | Si | $2.2 \times 10^{-3}$ Torr | 80/20 |
|   | 13 | 2 | 20.9 | 406 | 45.3 | Si | $2.2 \times 10^{-3}$ Torr | 80/20 |
|   | 14 | 3 | 19.5 | 396 | 44.6 | Si | $2.2 \times 10^{-3}$ Torr | 80/20 |
|   | 14 | 4 | 19.7 | 394 | 45.2 | Si | $2.2 \times 10^{-3}$ Torr | 80/20 |
|   | 15 | 5 | 19.8 | 414 | 45.3 | Si | $2.2 \times 10^{-3}$ Torr | 80/20 |
|   | 15 | 6 | 22.5 | 447 | 45.4 | Si | $2.2 \times 10^{-3}$ Torr | 80/20 |

Line Speed: 200"/mn
Glass thickness and type: 3.9 mm green tint
The resultant optical characteristics are:
Optics as coated, Ill. "C", 2° obs.

| TY 22.65 | RGY 16.02 | RFY 22.43 |
|---|---|---|
| a* −4.53 | a* −2.51 | a* +1.21 |
| b* −8.82 | b* −0.45 | b* +27.12 |

Sheet resist. = 65.3 ohms/sq.
Normal emit. = 0.50
Optics after heat treating*, Ill. "C", 2° obs.

| TY 23.04 | RGY 15.37 | RFY 23.46 |
|---|---|---|
| a* −4.07 | a* −3.52 | a* +0.04 |
| b* −7.13 | b* +1.15 | b* +22.15 |

Sheet resist. = 47.3 ohms/sq.
Normal emit. = 0.45
ΔT +0.39    ΔRG −0.65    ΔRF +1.03
ΔE 1.87    ΔE 1.09    ΔE 5.90
ΔSheet resist. = −18.0 ohms/sq.
ΔNormal emit. = −0.05

Testing

Chemical resistance:

| As coated - | No change in physical properties after boiling (230° F.) in 5% HCl acid for one hour |
| After heating - | no change in physical properties after boiling (230° F.) in 5% HCl acid for one hour |

Taber abrasion test: ΔT (transmission) @ 300 cycles and 500 gram load
    As coated -    ΔT = 8.1%
    After heating -    ΔT = 6.3%

*(heat treating was @ 665° C. cycled for an automated time period of 16 minutes)

Example 27

This example was formed on the equipment as described in Example 26 above. The same cathode, target gas ratios, pressures and process conditions were maintained as in Example 26 in Coating Zones #1 and #2 to achieve an undercoat of $Si_3N_4$ (and some aluminum nitride from dopant) of the same thickness as in Example 26. Changes were made, however, to the process conditions in Coating Zones #3, #4 and #5.

The gas composition in Coating Zone #3 was changed from 100% Argon to a 95% Argon, 5% oxygen atmosphere at the same pressure, and power was increased to the targets in Coating Zone #3 to give a metallic layer on glass (G) similar in thickness to that of Example 26. The layer system formed was that of FIG. 2B where M was the same Ni/Cr alloy as used in Example 26, but here partially oxidized. The glass was passed through Coating Zones #4 and #5 where, as before, a silicon nitride layer was formed on top of the metallic, now partially oxidized layer (M/O). This topcoat of $Si_3N_4$ was kept somewhat thinner than in Example 26 in order to more nearly match the desirable optics of Example 26. The advantage of the coating layer system in this example over Example 26 is that the sheet resistance (and normal emittance) of the product after heat treatment actually achieved, is in the range of typical "low-E" coatings. Thus, this coating layer system has the ability to reflect more infrared energy as compared to the coating layer system in Example 26. Chemical durability is reduced only slightly compared to Example 26, but mechanical durability is improved over Example 26's already good durability.

The process conditions are as follows:

| Zone | Cathode | Target | KW | Cathode Volts | Amps | Material | Pressure | Material N$_2$ %/Ar % |
|---|---|---|---|---|---|---|---|---|
| 1 | 1 | 1 | 35.4 | 424 | 70.9 | Si | 2.1 × 10$^{-3}$ Torr | 80/20 |
|  | 1 | 2 | 20.1 | 413 | 43.0 | Si | 2.1 × 10$^{-3}$ Torr | 80/20 |
|  | 2 | 3 | 27.7 | 409 | 60.4 | Si | 2.1 × 10$^{-3}$ Torr | 80/20 |
|  | 2 | 4 | 27.2 | 405 | 59.7 | Si | 2.1 × 10$^{-3}$ Torr | 80/20 |
|  | 3 | 5 | x | x | x | Si | 2.1 × 10$^{-3}$ Torr | 80/20 |
|  | 3 | 6 | x | x | x | Si | 2.1 × 10$^{-3}$ Torr | 80/20 |
| 2 | 4 | 1 | 27.2 | 408 | 60.0 | Si | 2.0 × 10$^{-3}$ Torr | 80/20 |
|  | 4 | 2 | 35.5 | 422 | 75.4 | Si | 2.0 × 10$^{-3}$ Torr | 80/20 |
|  | 5 | 3 | 31.8 | 457 | 67.7 | Si | 2.0 × 10$^{-3}$ Torr | 80/20 |
|  | 5 | 4 | 40.0 | 422 | 88.7 | Si | 2.0 × 10$^{-3}$ Torr | 80/20 |
|  | 6 | 5 | 45.5 | 433 | 97.8 | Si | 2.0 × 10$^{-3}$ Torr | 80/20 |
|  | 6 | 6 | 43.4 | 457 | 86.6 | Si | 2.0 × 10$^{-3}$ Torr | 80/20 |
| 3 | 7 | 1 | 18.6 | 451 | 39.9 | 80 Ni 20 Cr | 1.5 × 10$^{-3}$ Torr | 95 Oxygen 5 Ar |
|  | 8 | 2 | 19.1 | 481 | 39.8 | 80 Ni 20 Cr | 1.5 × 10$^{-3}$ Torr | 95 Oxygen 5 Ar |
|  | 9 | 3 | 18.7 | 468 | 39.1 | 80 Ni 20 Cr | 1.5 × 10$^{-3}$ Torr | 95 Oxygen 5 Ar |
| 4 | 10 | 1 | 12.3 | 409 | 27.7 | Si | 2.0 × 10$^{-3}$ Torr | 80/20 |
|  | 10 | 2 | 12.1 | 409 | 26.6 | Si | 2.0 × 10$^{-3}$ Torr | 80/20 |
|  | 11 | 3 | 11.3 | 408 | 26.1 | Si | 2.0 × 10$^{-3}$ Torr | 80/20 |
|  | 11 | 4 | 11.8 | 410 | 26.1 | Si | 2.0 × 10$^{-3}$ Torr | 80/20 |
|  | 12 | 5 | 12.0 | 412 | 26.4 | Si | 2.0 × 10$^{-3}$ Torr | 80/20 |
|  | 12 | 6 | 12.3 | 404 | 27.2 | Si | 2.0 × 10$^{-3}$ Torr | 80/20 |
| 5 | 13 | 1 | 12.1 | 385 | 27.6 | Si | 2.1 × 10$^{-3}$ Torr | 80/20 |
|  | 13 | 2 | 12.4 | 401 | 26.7 | Si | 2.1 × 10$^{-3}$ Torr | 80/20 |
|  | 14 | 3 | 11.3 | 390 | 26.3 | Si | 2.1 × 10$^{-3}$ Torr | 80/20 |
|  | 14 | 4 | 11.5 | 392 | 26.6 | Si | 2.1 × 10$^{-3}$ Torr | 80/20 |
|  | 15 | 5 | 11.5 | 410 | 26.8 | Si | 2.1 × 10$^{-3}$ Torr | 80/20 |
|  | 15 | 6 | 13.2 | 442 | 26.8 | Si | 2.1 × 10$^{-3}$ Torr | 80/20 |

The optical results achieved were as follows:

Optics as coated, I11. "C", 2° obs.

| TY | 18.70 | RGY | 12.76 | RFY | 25.12 |
|---|---|---|---|---|---|
| a* | −5.06 | a* | −0.43 | a* | +0.40 |
| b* | −1.04 | b* | −4.27 | b* | +24.56 |

Sheet resist. = 104.5 ohms/sq.
Normal emit. = 0.55

Optics after heat treating*, I11. "C", 2° obs.

| TY | 23.59 | RGY | 10.77 | RFY | 21.61 |
|---|---|---|---|---|---|
| a* | −5.46 | a* | −0.36 | a* | +0.54 |
| b* | −3.47 | b* | −4.84 | b* | +26.77 |

Sheet resist. = 15.2 ohms/sq.
Normal emit. = 0.183

| ΔT | +4.89 | ΔRG | −1.99 | ΔRF | −3.51 |
|---|---|---|---|---|---|
| ΔE | 6.03 | ΔE | 3.45 | ΔE | 4.74 |

ΔSheet resist. = −89.3 ohms/sq.
ΔNormal emit. = −0.37

Testing

Chemical resistance:

As coated - slight change in physical properties after boiling (230° F.)

| | |
|---|---|
| After heating - | in 5% HCl acid for one hour slight change in physical properties after boiling (230° F.) in 5% HCl acid for one hour |
| Taber abrasion test: | ΔT (transmission) @ 300 cycles and 500 gram load |
| As coated - | ΔT = 3.1% |
| After heating - | ΔT = 1.8% |

Once given the above disclosure many other features, modifications and improvements will become apparent to the skilled artisan. Such other features, modifications and improvements are therefore considered to be a part of this invention, the scope of which is to be determined by the following claims:

We claim:

1. A glass article which includes a glass substrate having thereon a sputter-coated layer system consisting essentially of from the glass substrate outward, (a) at least one substantially metallic layer which includes nickel or a nickel alloy; and (b) a layer of silicon nitride ($Si_3N_4$); and wherein the layers are each of sufficient thickness such that when the glass substrate has a thickness of about 1.5 mm–13 mm and has the said layer system thereon the so-layered glass article is heat treatable, and has a visible transmittance of about 1–80% and a normal emissivity ($E_n$) of about 0.10–0.60.

2. A glass article according to claim 1 wherein layer (a) is substantially free of any nitride.

3. A glass article according to claim 2 wherein said layer system includes an undercoat layer of silicon nitride ($Si_3N_4$) located between said substantially metallic layer and said glass substrate.

4. A glass article according to claim 2 wherein said substantially metallic layer includes a minor amount of a metallic oxide of the metal in said substantially metallic layer.

5. A glass article according to claim 4 wherein said layer system includes an undercoat layer of silicon nitride ($Si_3N_4$) located between said substantially metallic layer and said glass substrate.

6. A glass article according to claim 5 wherein said layer system further includes a stoichiometric metallic oxide layer overcoating said substantially metallic layer and another stoichiometric metallic oxide layer undercoating said substantially metallic layer.

7. A glass article according to claim 5 wherein said undercoat and overcoat layers of stoichiometric metallic oxide are each contiguous with said substantially metallic layer.

8. A glass article according to claim 1 wherein said layer system comprises a plurality of said substantially metallic layers and said silicon nitride ($Si_3N_4$) layer is an undercoat layer located between said glass substrate and the first of said plurality of said substantially metallic layers.

9. A glass article according to claim 8 wherein said layer system does not contain any layer of silver; wherein layer (a) is substantially free of any nitride; and wherein said so-layered glass article is durable and chemically resistant.

10. A glass article according to claim 9 wherein at least one of said substantially metallic layers includes a minor amount of a metallic oxide of the metal in said substantially metallic layer.

11. A glass article according to claim 8 wherein the metal in each of said substantially metallic layers is the same nickel alloy and wherein said silicon nitride layers include a minor amount of a conductive metal.

12. A glass article which includes a glass substrate having thereon a sputter-coated layer system comprising from the glass substrate outward, (a) a layer comprised of a mixture of silicon nitride ($Si_3N_4$) and nickel or a nickel alloy having at least 10% by wt. Ni; and (b) an overcoat layer consisting essentially of silicon nitride ($Si_3N_4$) and wherein the layers are each substantially continuous and of sufficient thickness such that when the glass substrate has a thickness of about 1.5 mm–13 mm and has the aforesaid layer system thereon the so-layered glass article is heat treatable, durable, chemically resistant, and has a visible transmittance of about 1–80% and a normal emissivity ($E_n$) of about 0.10–0.60.

13. A glass article according to claim 12 wherein said layer system further includes an undercoat layer consisting essentially of silicon nitride ($Si_3N_4$) located between the glass substrate and said layer (a) and wherein said silicon nitride layers include a minor amount of a conductive metal selected from the group consisting of titanium, zirconium, chromium, hafnium, and mixtures thereof.

14. A glass article according to claim 1 wherein said substantially metallic layer comprises said nickel alloy, said nickel alloy including chromium in a sufficient amount to make the system non-magnetic.

15. A glass article according to claims 1, 2, 3, 4, 5, 6, 7, 8, 9, 10, 11, 12, or 14, or wherein said glass article is unheat-treated.

16. A glass article according to claims 1, 2, 3, 4, 5, 6, 7, 8, 9, 10, 11, 12, or 14 wherein said glass article is heat treated.

17. A glass article according to claim 1 wherein after being heat treated the article has the following characteristics:

visible transmittance, about 1%–80%
visible reflectance (glass side), about 4%–55%
visible reflectance (film side), about 4%–65%
normal emittance ($E_n$), about 0.10–0.60
sheet resistance ($R_s$), about 2–250 ohms/sq.
solar transmission, about 1%–80%.

18. A method of heat treating a coated glass article comprising the steps of:

(a) sputter-coating onto a glass substrate the layer system of claim 1; and (b) thereafter subjecting this coated glass substrate to a heat treatment selected from the group consisting of bending, tempering, heat strengthening and combinations thereof; and (c) wherein after this heat treatment the resultant article has a normal emissivity ($E_n$) of about 0.10–0.60 and a visible transmittance of about 1–80%, and wherein said visible and solar transmittance are changed less than about 20% by said heat treatment.

19. The method according to claim 18 wherein said visible and solar transmittance was changed less than about 10% by said heat treatment; wherein said layer (a) is substantially free of any nitride; and wherein said coated glass article both before and after said heat treatment is durable and chemically resistant.

20. The method according to claim 19 wherein said visible and solar transmittance was changed less than about 2% by said heat treatment.

21. The method according to claim 18 wherein said sheet resistance ($R_s$) was not increased more than about 10% by said heat treatment.

22. The method according to claim 21 wherein said sheet resistance ($R_s$) was not increased by said heat treatment.

23. The method according to claim 22 wherein said sheet resistance ($R_s$) was decreased by said heat treatment.

24. The method according to claim 18 wherein said layer system does not contain any layer of silver, wherein said layer (a) is substantially free of any nitride; and wherein said coated glass article both before and after said heat treatment is durable and chemically resistant.

25. The method according to claim 24 wherein said steps further include sputter coating onto said substrate an undercoat layer of silicon nitride ($Si_3N_4$) located between said substantially metallic layer and said glass substrate.

26. The method according to claim 24 wherein said substantially metallic layer includes a minor amount of a metallic oxide of the metal in said metallic layer.

27. The method according to claim 26 wherein said steps further include sputter coating onto said substrate an undercoat layer of silicon nitride located between said substantially metallic layer and said glass substrate.

28. The method according to claim 27 wherein said steps further include sputtering a substantially stoichiometric metallic oxide layer overcoat above said substantially metallic layer and sputter coating another substantially stoichiometric metallic oxide layer undercoat beneath said substantially metallic layer.

29. The method according to claim 28 wherein said sputter coating of said undercoat and overcoat layers of substantially stoichiometric metallic oxide occurs immediately before and immediately after, respectively, said sputter coating of said substantially metallic layer so as to be contiguous therewith.

30. The method according to claim 18 wherein said heat treatment is conducted at a temperature from about 1150° F.–1450° F.

31. The method according to claim 18 wherein said silicon nitride layer includes a minor amount of a conductive metal.

32. A method of heat treating a coated glass article comprising the steps of:
  (a) sputter coating onto a glass substrate the layer system of claim 5; and
  (b) thereafter subjecting the coated glass substrate to a heat treatment selected from the group consisting of bending, tempering, heat strengthening and combinations thereof; and
  (c) wherein after this heat treatment the resultant article has a normal emissivity ($E_n$) of about 0.10–0.60 and a visible transmittance of about 1–80%, and wherein said visible and solar transmittance are changed less than about 20% by said heat treatment.

33. A method according to claim 32 which includes the further step of sputter coating an undercoat layer of silicon nitride ($Si_3N_4$) so as to be located between said glass substrate and said layer comprised of a mixture of silicon nitride ($Si_3N_4$) and nickel or nickel alloy.

34. A method according to claim 33 wherein said silicon nitride includes a minor amount of a conductive metal.

35. A method according to claim 32 wherein said heat treatment is conducted at about 1150° F.–1450° F.

36. A glass article according to claim 2 wherein said so-layered glass article is durable and chemically resistant.

* * * * *